US012729451B2

(12) United States Patent
Okamoto et al.

(10) Patent No.: US 12,729,451 B2
(45) Date of Patent: Sep. 8, 2026

(54) SURFACE-TREATED COPPER FOIL, AND COPPER-CLAD LAMINATE AND PRINTED WIRING BOARD INCLUDING THE SURFACE-TREATED COPPER FOIL

(71) Applicant: FUKUDA METAL FOIL & POWDER CO., LTD., Kyoto (JP)

(72) Inventors: Takeshi Okamoto, Kyoto (JP); Kenta Miyamoto, Kyoto (JP)

(73) Assignee: FUKUDA METAL FOIL & POWDER CO., LTD., Kyoto (JP)

( * ) Notice: Subject to any disclaimer, the term of this patent is extended or adjusted under 35 U.S.C. 154(b) by 0 days.

(21) Appl. No.: 18/870,852

(22) PCT Filed: Aug. 8, 2023

(86) PCT No.: PCT/JP2023/028850
§ 371 (c)(1),
(2) Date: Dec. 2, 2024

(87) PCT Pub. No.: WO2024/116475
PCT Pub. Date: Jun. 6, 2024

(65) Prior Publication Data

US 2025/0327203 A1 Oct. 23, 2025

(30) Foreign Application Priority Data

Nov. 28, 2022 (JP) ................................ 2022-189414

(51) Int. Cl.
*C25D 5/12* (2006.01)
*B32B 15/08* (2006.01)
(Continued)

(52) U.S. Cl.
CPC ................ *C25D 5/12* (2013.01); *B32B 15/08* (2013.01); *B32B 15/20* (2013.01); *B32B 37/24* (2013.01);
(Continued)

(58) Field of Classification Search
None
See application file for complete search history.

(56) References Cited

FOREIGN PATENT DOCUMENTS

CN 106413248 B 5/2019
JP 2006-324546 A 11/2006
(Continued)

OTHER PUBLICATIONS

Jan. 9, 2024 Notice of Reasons for Refusal issued in Japanese Patent Application No. 2023-569671.
(Continued)

*Primary Examiner* — Tae H Yoon
(74) *Attorney, Agent, or Firm* — Oliff PLC

(57) ABSTRACT

A surface-treated copper foil includes a roughening treatment layer on at least one surface of an untreated copper foil, a heat-resistant treatment layer on the roughening treatment layer, and a chromate treatment layer on the heat-resistant treatment layer. The roughening treatment layer is formed of copper particles having a primary particle size of 0.5 μm or more and 0.9 μm or less. The heat-resistant treatment layer is a heat-resistant treatment layer containing cobalt and molybdenum. The chromate treatment layer has a treatment surface with a gloss Gs (85°) of 60 or more and 80 or less.

6 Claims, 2 Drawing Sheets

(51) Int. Cl.

| | |
|---|---|
| ***B32B 15/20*** | (2006.01) |
| ***B32B 37/24*** | (2006.01) |
| ***C25D 3/04*** | (2006.01) |
| ***C25D 3/38*** | (2006.01) |
| ***C25D 3/56*** | (2006.01) |
| ***C25D 3/58*** | (2006.01) |
| ***H05K 1/09*** | (2006.01) |
| ***H05K 3/38*** | (2006.01) |

(52) U.S. Cl.

CPC ................ *C25D 3/04* (2013.01); *C25D 3/38* (2013.01); *C25D 3/562* (2013.01); *H05K 1/09* (2013.01); *H05K 3/382* (2013.01); *B32B 2037/243* (2013.01); *B32B 2250/02* (2013.01); *B32B 2255/06* (2013.01); *B32B 2255/205* (2013.01); *B32B 2305/55* (2013.01); *B32B 2307/206* (2013.01); *B32B 2311/12* (2013.01); *B32B 2311/22* (2013.01); *B32B 2457/08* (2013.01); *H05K 2203/0307* (2013.01)

(56) References Cited

FOREIGN PATENT DOCUMENTS

| | | | | |
|---|---|---|---|---|
| JP | 2007-332418 | A | | 12/2007 |
| JP | 4072431 | B2 | * | 4/2008 |
| JP | 2016-135927 | A | | 7/2016 |
| TW | I285686 | | * | 8/2007 |
| TW | 202137841 | A | | 10/2021 |
| WO | 2016/093109 | A1 | | 6/2016 |
| WO | WO 2021/193863 | A1 | * | 9/2021 |

OTHER PUBLICATIONS

Oct. 24, 2023 International Search Report issued in International Patent Application No. PCT/JP2023/028850.

Oct. 24, 2023 Written Opinion issued in International Patent Application No. PCT/JP2023/028850.

May 14, 2024 Decision to Grant a Patent issued in Japanese Patent Application No. 2023-569671.

* cited by examiner

[Fig. 1]
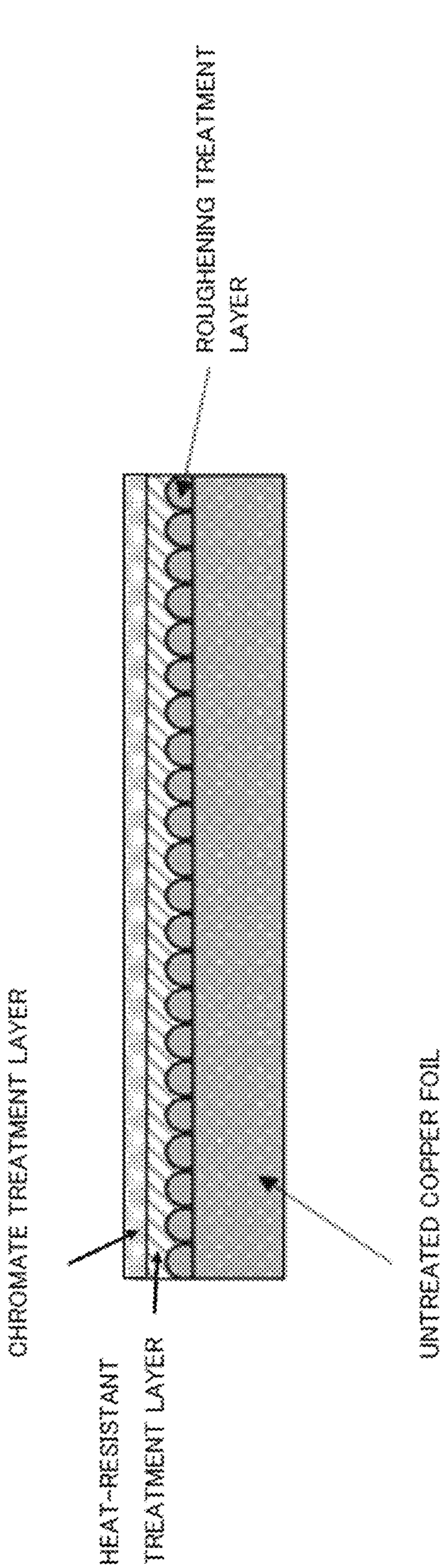

[Fig. 2]
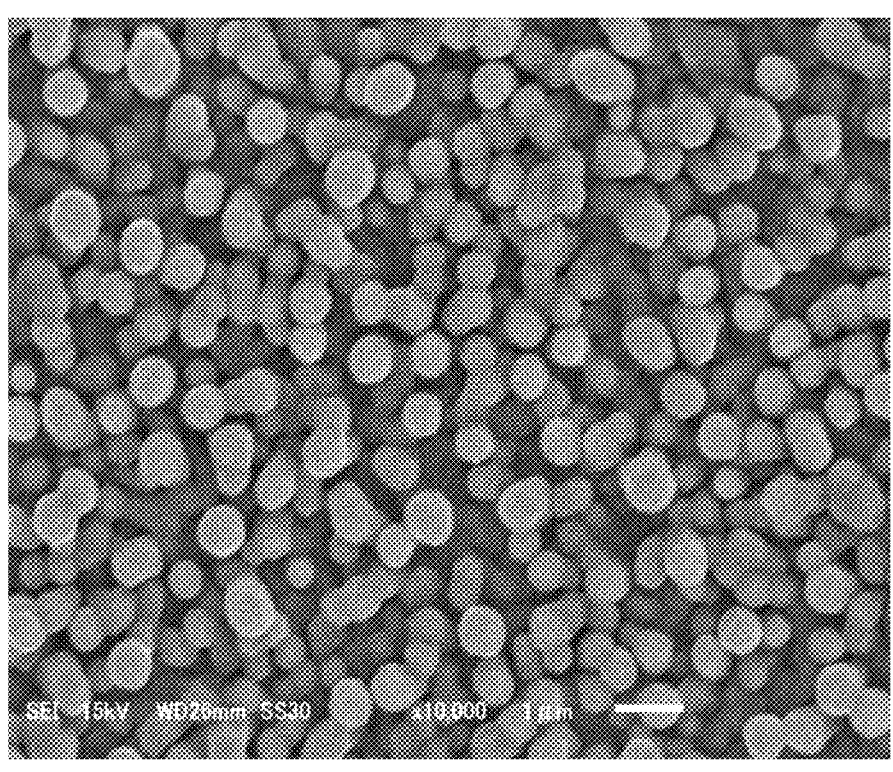

SURFACE-TREATED COPPER FOIL, AND COPPER-CLAD LAMINATE AND PRINTED WIRING BOARD INCLUDING THE SURFACE-TREATED COPPER FOIL

CROSS REFERENCE TO RELATED APPLICATIONS

This is a Bypass Continuation of PCT/JP2023/028850 filed Aug. 8, 2023, which claims the benefit JP 2022-189414 filed Nov. 28, 2022. The disclosure of the prior applications is hereby incorporated by reference herein in its entirety.

TECHNICAL FIELD

The present invention relates to a surface-treated copper foil. Specifically, the surface-treated copper foil includes a roughening treatment layer formed of copper particles having a primary particle size of 0.5 μm to 0.9 μm and therefore has a superior anchor effect on an insulating resin substrate. In addition, the surface-treated copper foil includes a heat-resistant treatment layer containing cobalt and molybdenum on the roughening treatment layer and a chromate treatment layer containing chromium on the heat-resistant treatment layer. Therefore, the surface of the roughening treatment layer is less susceptible to oxidation, and the copper particles are also less susceptible to deformation. Thus, the surface-treated copper foil can maintain high adhesion and achieve high heat resistance on a low-dielectric resin substrate with high forming temperature. Furthermore, the chromate treatment layer has a treatment surface with a gloss Gs (85°) of 60 to 80 and the copper particles are sparsely formed, which results in low insertion loss. Thus, the surface-treated copper foil is suitable for use in the manufacture of a printed wiring board for high-frequency signal transmission that includes a low-dielectric resin substrate with a forming temperature of 300° C. or higher.

BACKGROUND ART

In Japan, the fifth-generation mobile communication system (5G) service has started since March 2020, and high-speed communication has been available in limited urban areas.

In addition, automobiles equipped with advanced driver-assistance systems (ADAS) are expanding from luxury cars to small cars. For example, it is becoming more and more common to automatically control the following distance by detecting that the vehicle is approaching the preceding vehicle during driving at constant speed under cruise control on expressways and to automatically activate a braking device by detecting an object such as a pedestrian or bicycle suddenly appearing in urban areas, contributing to reduced drivers' burden and traffic accidents.

Whereas 5G currently often uses a frequency band of 3.6 GHz to less than 6 GHZ, which is called sub-6, the use of a higher frequency band, i.e., frequencies of 28 GHz or more, which are called millimeter waves, is expected to increase in future.

In addition, the number of automobiles equipped with ADAS is also expected to increase in future. As there is an increasing demand for millimeter-wave radars that use a frequency band of 24 GHz to 79 GHZ, which are one type of sensor that supports ADAS, there is an increasing demand for millimeter-wave radars with higher levels of performance.

Communication systems that use such high frequency bands are required to transmit signals not only at high speed, but also at low loss.

Whether signals can be transmitted at low loss is strongly affected by the physical properties, i.e., dielectric characteristics and conductor resistance, of insulating resin substrates and copper foils that form components such as printed wiring boards and antennas.

In general, insertion loss is the sum of dielectric loss and conductor loss.

Dielectric loss is mainly attributed to insulating resin substrates and is affected by their dielectric characteristics. Insertion loss tends to increase with increasing dielectric constant and dielectric loss tangent, and this tendency is more noticeable at high frequencies.

Conductor loss is mainly attributed to copper foils and is affected not only by the surface roughness of copper foils, but also by, for example, the type and amount of dissimilar metal deposited. Insertion loss tends to increase when copper foils have large surface roughness or when a magnetic metal is used, and this tendency is more noticeable at high frequencies.

Accordingly, insulating resin substrates with superior dielectric characteristics are preferred to transmit signals at frequencies of about 30 GHz or more, which are called millimeter waves, at low loss. In particular, low-dielectric resin substrates formed of resins such as liquid crystal polymer resins and fluorocarbon resins, which have low relative dielectric constants and dielectric loss tangents, are expected to be used.

In addition, copper foils with smaller surface roughness and smaller amounts of magnetic metal deposited thereon are preferred, and many copper foils subjected to fine roughening treatment and copper foils with considerably reduced amounts of dissimilar metal for treatment are proposed.

When a copper-clad laminate is fabricated using a liquid crystal polymer substrate or a fluorocarbon resin-containing substrate, the substrate needs to be heated to a high temperature of 300° C. or higher for forming. However, copper foils subjected to fine roughening treatment with a primary particle size on the submicron order or less and treated copper foils with no or extremely smalls amounts of dissimilar metal deposited thereon have a problem in that the surface of the roughening treatment layer is susceptible to oxidation and the roughening particles are susceptible to changes in shape at high temperature, which results in a weak physical anchor effect and therefore insufficient adhesion.

In addition, even if the adhesion is high in a normal state, there is a problem in that significant deterioration occurs after a long-term heat resistance test.

To reduce the oxidation of the surface of the roughening treatment layer and the deformation of the roughening particles during forming at a high temperature of 300° C. or higher to ensure sufficient adhesion, it is necessary to increase the amount of dissimilar metal for treatment or to increase the size of the roughening particles.

However, there is a problem in that increasing the amount of dissimilar metal for treatment or increasing the size of the roughening particles results in increased insertion loss.

Accordingly, there is a need to develop a surface-treated copper foil that has sufficient adhesion and heat resistance on a low-dielectric resin substrate with a forming temperature of 300° C. or higher, that exhibits reduced insertion loss in high-frequency signal transmission, and that is suitable for use in a printed wiring board for high-frequency signal transmission that includes a low-dielectric resin substrate.

CITATION LIST

Patent Literature

PTL 1: Japanese Unexamined Patent Application Publication No. 2015-147978
PTL 2: Japanese Unexamined Patent Application Publication No. 2021-098892

SUMMARY OF INVENTION

Technical Problem

PTL 1 describes a surface-treated copper foil in which there are one or more and less than five roughening particles having a roughening height of 1.5 μm or more and ten or more roughening particles having a roughening height of 1.0 μm or less within a lateral length of 30 μm in a cross-section of the surface-treated copper foil in the lateral direction. According to PTL 1, the surface-treated copper foil has high adhesion to a low-dielectric resin substrate with a forming temperature of 300° C. or higher and also has superior transmission characteristics as a copper foil for high-frequency circuits.

However, there is a problem in that the presence of many roughening particles results in increased insertion loss, even if the roughening height is 1.0 μm or less.

PTL 2 describes a surface-treated copper foil including a surface treatment layer formed on at least one surface of an untreated copper foil and an oxidation-preventing layer formed on the surface treatment layer. The surface treatment layer includes copper particles having an average particle size of about 10 nm to 100 nm and has a ten-point average roughness Rz of about 0.2 μm to 0.5 μm and a gloss Gs (60°) of about 200 or more. The oxidation-preventing layer contains nickel and phosphorous. According to PTL 2, the surface-treated copper foil has high adhesion strength to an insulating resin substrate, has low insertion loss, and is superior as a high-frequency foil.

However, for a low-dielectric resin substrate with a forming temperature of 300° C. or higher, there is a problem in that the adhesion to the resin substrate decreases because the copper particles are susceptible to deformation at high temperature during forming, and the adhesion also decreases when the copper foil is exposed to high temperature for a long period of time after forming.

As a result of fabrication and evaluation of many prototypes in view of the technical challenge of solving the various problems described above, the inventors have made the remarkable finding that a surface-treated copper foil including a roughening treatment layer on at least one surface of an untreated copper foil, a heat-resistant treatment layer on the roughening treatment layer, and a chromate treatment layer on the heat-resistant treatment layer, the roughening treatment layer being formed of copper particles having a primary particle size of 0.5 μm or more and 0.9 μm or less, the heat-resistant treatment layer being a heat-resistant treatment layer containing cobalt and molybdenum, the chromate treatment layer having a treatment surface with a gloss Gs (85°) of 60 or more and 80 or less, exhibits high adhesion to a low-dielectric resin substrate with a forming temperature of 300° C. or higher, can maintain high adhesion to a degree that does not cause a problem in practical use when the copper foil is exposed to high temperature for a long period of time, and serves as a surface-treated copper foil with low conductor loss that can take advantage of superior transmission characteristics due to a low-dielectric resin substrate, thus achieving the foregoing technical challenge.

Solution to Problem

The foregoing technical challenge can be solved by the present invention as follows.

The present invention is a surface-treated copper foil including a roughening treatment layer on at least one surface of an untreated copper foil, a heat-resistant treatment layer on the roughening treatment layer, and a chromate treatment layer on the heat-resistant treatment layer. The roughening treatment layer is formed of copper particles having a primary particle size of 0.5 μm or more and 0.9 μm or less. The heat-resistant treatment layer is a heat-resistant treatment layer containing cobalt and molybdenum. The chromate treatment layer has a treatment surface with a gloss Gs (85°) of 60 or more and 80 or less.

In addition, the present invention is the surface-treated copper foil described above, wherein each of the roughening treatment layer, the heat-resistant treatment layer, and the chromate treatment layer has a treatment surface with an arithmetic mean height Sa of 0.08 μm or more and 0.16 μm or less.

In addition, the present invention is the surface-treated copper foil described above, including a silane coupling agent treatment layer on the chromate treatment layer.

In addition, the present invention is a copper-clad laminate including an insulating resin substrate on which the surface-treated copper foil described above is laminated.

In addition, the present invention is the copper-clad laminate described above, wherein the insulating resin substrate is a low-dielectric resin substrate.

In addition, the present invention is a printed wiring board including the copper-clad laminate described above.

Advantageous Effects of Invention

Because the roughening treatment layer of the surface-treated copper foil of the present invention is formed of relatively large copper particles having a primary particle size of 0.5 μm to 0.9 μm, the surface-treated copper foil has a superior anchor effect on an insulating resin substrate.

In addition, because the heat-resistant treatment layer contains cobalt and molybdenum and the chromate treatment layer contains chromium, the surface of the roughening treatment layer is less susceptible to oxidation and the copper particles are also less susceptible to deformation at high temperature. Thus, the surface-treated copper foil can maintain high adhesion and has high heat resistance on a low-dielectric resin substrate with a forming temperature of 300° C. or higher.

Furthermore, because the chromate treatment layer has a treatment surface with a gloss Gs (85°) of 60 to 80, which is a relatively high value, and the copper particles are sparsely formed, the surface-treated copper foil has low insertion loss.

In addition, when each of the roughening treatment layer, the heat-resistant treatment layer, and the chromate treatment layer has a treatment surface with an arithmetic mean height Sa of 0.08 μm to 0.16 μm, the surface-treated copper foil has lower insertion loss.

In addition, when the surface-treated copper foil includes the silane coupling agent treatment layer on the chromate treatment layer, the surface-treated copper foil has higher adhesion and heat resistance.

Thus, the surface-treated copper foil of the present invention is suitable for use in the manufacture of a printed wiring board for high-frequency signal transmission that includes a low-dielectric resin substrate with a forming temperature of 300° C. or higher.

BRIEF DESCRIPTION OF DRAWINGS

FIG. 1 is a schematic view of a surface-treated copper foil of the present invention.

FIG. 2 is a scanning electron micrograph (10,000 times) of a surface-treated copper foil (Example 1) of the present invention.

The present invention is a surface-treated copper foil including a roughening treatment layer on at least one surface of an untreated copper foil, a heat-resistant treatment layer on the roughening treatment layer, and a chromate treatment layer on the heat-resistant treatment layer.

<Untreated Copper Foil>

The copper foil before surface treatment (hereinafter referred to as "untreated copper foil") of the present invention is not particularly limited, and a copper foil without distinction between front and back sides, such as a rolled copper foil, and a copper foil with distinction between front and back sides, such as an electrolytic copper foil, can both be used.

The surface to be subjected to surface treatment is not particularly limited. A rolled copper foil may have either surface thereof subjected to surface treatment. An electrolytic copper foil may have either a precipitated surface or a drum surface thereof subjected to surface treatment.

The surface to be subjected to surface treatment preferably has a gloss Gs (60°) of 500 or more as measured in terms of specular gloss at 60° in accordance with JIS Z 8471.

When a rolled copper foil is used, the copper foil is preferably immersed in a hydrocarbon-based organic solvent or an alkaline degreasing solution to remove rolling oil before surface treatment.

When an electrolytic copper foil is used, the copper foil is preferably immersed in dilute sulfuric acid to remove an oxide film before surface treatment.

Although the thickness of the untreated copper foil is not particularly limited as long as the untreated copper foil has a thickness that allows it to be used for a printed wiring board after surface treatment, the untreated copper foil preferably has a thickness of 6 μm to 300 μm, more preferably 12 μm to 35 μm.

<Roughening Treatment Layer>

The surface-treated copper foil of the present invention includes a roughening treatment layer formed of copper particles as roughening particles on the untreated copper foil.

The copper particles preferably have a primary particle size of 0.5 μm to 0.9 μm, more preferably 0.6 μm to 0.8 μm.

Although the lower limit of the primary particle size is 0.5 μm in the present invention, the lower limit is not intended to exclude the inclusion of copper particles having a primary particle size of 0.5 μm or less.

However, if there are many copper particles having a primary particle size of less than 0.5 μm, the surface of the roughening treatment layer may be oxidized and the copper particles may be deformed when the copper foil is laminated on a low-dielectric resin substrate with a forming temperature of 300° C. or higher, which may decrease the anchor effect on the low-dielectric resin substrate and may significantly decrease the adhesion and the heat resistance.

On the other hand, if there are many copper particles having a primary particle size of more than 0.9 μm, the conductor loss may increase because of increased surface roughness.

The primary particle size can be determined by selecting ten copper particles from those observed under a scanning electron microscope at an inclination angle of 0° and a magnification of 10,000 times, measuring the maximum length of each copper particle, and calculating the average thereof.

The roughening treatment layer of the present invention can be formed by forming a copper particle layer on the untreated copper foil and then subjecting the copper particle layer to copper plating.

The copper particle layer can be formed using, as an electrolytic solution, an aqueous solution containing 20 g/L to 110 g/L of copper sulfate pentahydrate, 45 g/L to 150 g/L of sulfuric acid, 4 mg/L to 60 mg/L of tungsten ions, and 225 mg/L to 1200 mg/L of titanium ions at a liquid temperature of 40° C. by immersing an insoluble electrode formed of platinum group oxide-coated titanium as an anode in the electrolytic solution, immersing the untreated copper foil as a cathode at a certain distance on the opposite side, and performing electrolysis such that the current density is 10 $A/dm^2$ to 40 $A/dm^2$ and the quantity of electricity is 20 $C/dm^2$ to 100 $C/dm^2$.

Copper plating may be performed using, as an electrolytic solution, an aqueous solution containing 150 g/L to 300 g/L of copper sulfate pentahydrate and 50 g/L to 400 g/L of sulfuric acid at a liquid temperature of 40° C. by immersing an insoluble electrode formed of platinum group oxide-coated titanium as an anode in the electrolytic solution, immersing the copper foil having the copper particle layer thereon as a cathode at a certain distance on the opposite side, and performing electrolysis such that the current density is 2 $A/dm^2$ to 10 $A/dm^2$ and the quantity of electricity is 60 $C/dm^2$ to 240 $C/dm^2$.

<Heat-Resistant Treatment Layer and Chromate Treatment Layer>

The present invention is a surface-treated copper foil including a heat-resistant treatment layer containing cobalt and molybdenum on the roughening treatment layer and a chromate treatment layer containing chromium on the heat-resistant treatment layer.

This is because, if the heat-resistant treatment layer and the chromate treatment layer are not formed, after a copper-clad laminate is fabricated by laminating the copper foil on a low-dielectric resin substrate, the copper foil may exhibit significantly decreased adhesion to the low-dielectric resin substrate when exposed to a high temperature of 150° C. or higher.

The heat-resistant treatment layer can be formed by performing electrolysis while immersing the copper foil having the roughening treatment layer formed on the untreated copper foil in an electrolytic solution.

The electrolytic solution for forming the heat-resistant treatment layer is preferably an aqueous solution containing 20 g/L to 70 g/L of a cobalt-containing compound, 10 g/L to 50 g/L of a molybdenum-containing compound, and 10 g/L to 100 g/L of trisodium citrate dihydrate and prepared at a pH of 4 to 10.

Electrolysis is preferably performed by immersing an insoluble electrode formed of platinum group oxide-coated titanium or the like as an anode in the electrolytic solution and immersing the copper foil having the roughening treatment layer formed thereon as a cathode at a certain distance on the opposite side under the electrolysis conditions that the current density is 3 A/dm$^2$ to 14 A/dm$^2$, the quantity of electricity is 7 C/dm$^2$ to 30 C/dm$^2$, and the liquid temperature is 25° C. to 45° C.

Although the cobalt-containing compound is not particularly limited, examples thereof include cobalt sulfate heptahydrate and cobalt chloride hexahydrate.

Although the molybdenum-containing compound is not particularly limited, examples thereof include disodium molybdate dihydrate.

The chromate treatment layer can be formed by performing electrolysis while immersing the copper foil having the heat-resistant treatment layer formed thereon in an electrolytic solution.

The electrolytic solution for forming the chromate treatment layer is preferably an aqueous solution containing 10 g/L to 60 g/L of a chromate-containing compound or containing 10 g/L to 60 g/L of a chromate-containing compound and 0.2 g/L to 4.0 g/L of zinc ions and prepared at a pH of 2 to 12 with sulfuric acid or sodium hydroxide.

Electrolysis is preferably performed by immersing an insoluble electrode formed of platinum group oxide-coated titanium or the like as an anode in the electrolytic solution and immersing the copper foil having the heat-resistant treatment layer formed thereon as a cathode at a certain distance on the opposite side under the electrolysis conditions that the current density is 0.5 A/dm$^2$ to 5 A/dm$^2$, the quantity of electricity is 1 C/dm$^2$ to 6 C/dm$^2$, and the liquid temperature is 25° C. to 50° C.

Although the chromate-containing compound is not particularly limited, examples thereof include sodium dichromate dihydrate.

Although the zinc ion source is not particularly limited, examples thereof include zinc oxide.

<Gloss>

The present invention is a surface-treated copper foil including a chromate treatment layer having a treatment surface with a gloss Gs (85°) of 60 to 80.

This is because a gloss of less than 60 may result in increased conductor loss because of too many copper particles, whereas a gloss of more than 80 may result in insufficient adhesion and heat resistance on a low-dielectric resin substrate because of too few copper particles.

Gs (85°) may be measured in terms of specular gloss at 85° in accordance with JIS Z 8741.

<Surface Roughness>

Each of the roughening treatment layer, the heat-resistant treatment layer, and the chromate treatment layer of the surface-treated copper foil of the present invention preferably has a treatment surface with an arithmetic mean height Sa of 0.08 μm to 0.16 μm, more preferably 0.09 μm to 0.15 μm.

This is because an arithmetic mean height Sa of less than 0.08 μm may result in insufficient adhesion and heat resistance on a low-dielectric resin substrate, whereas an arithmetic mean height Sa of more than 0.16 μm may result in increased conductor loss.

<Silane Coupling Agent Treatment Layer>

The surface-treated copper foil of the present invention can include a silane coupling agent treatment layer on the chromate treatment layer.

The formation of the silane coupling agent treatment layer on the chromate treatment layer provides a surface-treated copper foil with higher adhesion and heat resistance.

The silane coupling agent treatment layer can be formed by immersing the copper foil having the chromate treatment layer formed thereon in a silane coupling agent aqueous solution prepared at a liquid temperature of 20° C. to 50° C., or applying the silane coupling agent aqueous solution by a method such as spraying, followed by washing with water.

The silane coupling agent used for the silane coupling agent layer is not particularly limited, and a silane coupling agent containing a vinyl group, an epoxy group, a styryl group, a methacrylic group, an acrylic group, an amino group, an ureido group, or a mercapto group can be used. A silane coupling agent containing an amino group, an epoxy group, or a vinyl group is more suitable for use because it provides very high moisture absorption resistance and rust resistance.

One silane coupling agent or a combination of two or more silane coupling agents may be used.

Examples of compositions and conditions for the aqueous solution for forming the silane coupling agent treatment layer include 1 mL/L to 5 mL/L of γ-aminopropyltriethoxysilane, a liquid temperature of 25° C. to 35° C., and an immersion time of 15 seconds.

<Insulating Resin Substrate>

Although the insulating resin substrate used for the copper-clad laminate of the present invention is not particularly limited, examples thereof include epoxy resin substrates and polyimide resin substrates and also include, as low-dielectric resin substrates, polyphenylene ether resin substrates, bismaleimide-triazine resin substrates, and cycloolefin polymer resin substrates.

In addition, the surface-treated copper foil of the present invention is also suitable for use on a low-dielectric resin substrate with a forming temperature of 300° C. or higher.

Examples of low-dielectric resin substrates with a forming temperature of 300° C. or higher include liquid crystal polymer resin substrates and fluorocarbon resin-containing substrates.

EXAMPLES

Examples of the present invention will be given below, although the present invention is not limited thereto.

<Untreated Copper Foil>

Electrolytic copper foils having a nominal thickness of 18 μm and a gloss Gs (60°) of 500 or more were used as untreated copper foils of the Examples and Comparative Examples.

The electrolytic copper foils were immersed in dilute sulfuric acid to remove an oxide film before various treatments.

Example 1

<Formation of Roughening Treatment Layer>

A copper particle layer was formed on the untreated copper foil using, as an electrolytic solution, an aqueous solution containing 47 g/L of copper sulfate pentahydrate, 95 g/L of sulfuric acid, 15 mg/L of tungsten ions, and 500 mg/L of titanium ions at a liquid temperature of 40° C. by immersing an insoluble electrode formed of platinum group oxide-coated titanium as an anode in the electrolytic solution, immersing the untreated copper foil as a cathode at a certain distance on the opposite side, and performing electrolysis such that the current density was 25 A/dm$^2$ and the quantity of electricity was 50 C/dm$^2$. The formed copper particle layer was dendritic.

A roughening treatment layer was formed using, as an electrolytic solution, an aqueous solution containing 220 g/L of copper sulfate pentahydrate and 110 g/L of sulfuric acid at a liquid temperature of 40° C. by immersing an insoluble electrode formed of platinum group oxide-coated titanium as an anode in the electrolytic solution, immersing the copper foil having the copper particle layer formed thereon in advance as a cathode at a certain distance on the opposite side, and subjecting the copper particle layer to copper plating by performing electrolysis such that the current density was 10 A/dm$^2$ and the quantity of electricity was 120 C/dm$^2$.

<Formation of Heat-Resistant Treatment Layer>

An aqueous solution containing 39 g/L of cobalt sulfate heptahydrate, 24 g/L of disodium molybdate dihydrate, and 45 g/L of trisodium citrate dihydrate and prepared at a pH of 5.6 was used as an electrolytic solution.

A heat-resistant treatment layer was formed by immersing an insoluble electrode formed of platinum group oxide-coated titanium as an anode in the electrolytic solution, immersing the copper foil having the roughening treatment layer formed thereon as a cathode at a certain distance on the opposite side, and performing electrolysis under the electrolysis conditions that the current density was 7 A/dm$^2$, the quantity of electricity was 14 C/dm$^2$, and the liquid temperature was 30° C.

<Chromate Treatment Layer>

An aqueous solution containing 12.5 g/L of sodium dichromate dihydrate and 2.5 g/L of zinc ions and prepared at a pH of 12 was used as an electrolytic solution.

A chromate treatment layer was formed by immersing an insoluble electrode formed of platinum group oxide-coated titanium as an anode in the electrolytic solution, immersing the copper foil having the heat-resistant treatment layer formed thereon as a cathode at a certain distance on the opposite side, and performing electrolysis under the electrolysis conditions that the current density was 2 A/dm$^2$, the quantity of electricity was 10 C/dm$^2$, and the liquid temperature was 25° C.

<Silane Coupling Agent Treatment Layer>

A silane coupling agent treatment layer was formed by immersing the copper foil having the chromate treatment layer formed thereon in an aqueous solution containing 5 ml/L of γ-aminopropyltriethoxysilane at a liquid temperature of 25° C. for 10 seconds and then lifting and drying the copper foil. Thus, a surface-treated copper foil was obtained (FIG. 2).

Example 2

A surface-treated copper foil was fabricated under the same conditions as in Example 1 except that, as the conditions for forming the roughening treatment layer, the copper particle layer was formed in the first step under the electrolysis conditions that the current density was 22 A/dm$^2$ and the quantity of electricity was 55 C/dm$^2$.

Example 3

A surface-treated copper foil was fabricated under the same conditions as in Example 1 except that, as the conditions for forming the roughening treatment layer, the copper particle layer was formed in the first step under the electrolysis conditions that the current density was 23 A/dm$^2$ and the quantity of electricity was 52 C/dm$^2$, and no silane coupling agent treatment layer was provided.

Comparative Example 1

A surface-treated copper foil was fabricated under the same conditions as in Example 1 except that, as the conditions for forming the roughening treatment layer, the copper particle layer was formed in the first step under the electrolysis conditions that the current density was 16 A/dm$^2$ and the quantity of electricity was 40 C/dm$^2$.

Comparative Example 2

A surface-treated copper foil was fabricated under the same conditions as in Example 1 except that, as the conditions for forming the roughening treatment layer, the copper particle layer was formed in the first step under the electrolysis conditions that the current density was 24 A/dm$^2$ and the quantity of electricity was 60 C/dm$^2$.

Comparative Example 3

A surface-treated copper foil was fabricated under the same conditions as in Example 1 except that, as the conditions for forming the roughening treatment layer, the copper particle layer was formed in the first step using, as an electrolytic solution, an aqueous solution containing 57 g/L of copper sulfate pentahydrate, 100 g/L of sulfuric acid, 15 mg/L of tungsten ions, and 35 mg/L of chlorine ions at a liquid temperature of 40° C. under the electrolysis conditions that the current density was 50 A/dm$^2$ and the quantity of electricity was 125 C/dm$^2$, and the copper particle layer was subjected to copper plating in the second step under the electrolysis conditions that the current density was 5 A/dm$^2$ and the quantity of electricity was 440 C/dm$^2$.

Comparative Example 4

A surface-treated copper foil was fabricated under the same conditions as in Example 1 except that, as the conditions for forming the roughening treatment layer, the copper particle layer was formed in the first step using, as an electrolytic solution, an aqueous solution containing 100 g/L of copper sulfate pentahydrate, 100 g/L of sulfuric acid, 150 mg/L of indium sulfate nonahydrate, and 5 g/L of a decomposition product of starch at a liquid temperature of 40° C. under the electrolysis conditions that the current density was 50 A/dm$^2$ and the quantity of electricity was 130 C/dm$^2$, and no copper plating treatment was performed.

Comparative Example 5

A surface-treated copper foil was fabricated under the same conditions as in Example 1 except that, as the conditions for forming the roughening treatment layer, the copper particle layer was formed in the first step under the electrolysis conditions that the current density was 22 A/dm$^2$ and the quantity of electricity was 55 C/dm$^2$, and no heat-resistant treatment layer was formed.

Comparative Example 6

A surface-treated copper foil was fabricated under the same conditions as in Example 1 except that, as the conditions for forming the roughening treatment layer, the copper particle layer was formed in the first step under the electrolysis conditions that the current density was 22 A/dm$^2$ and the quantity of electricity was 55 C/dm$^2$, and as the conditions for forming the heat-resistant treatment layer, an aqueous solution containing 30 g/L of nickel sulfate hexahydrate, 2 g/L of sodium hypophosphite monohydrate, and 10 g/L of sodium acetate trihydrate and prepared at a pH of 4.5 with sulfuric acid was used as an electrolytic solution, and electrolysis was performed under the conditions that the current density was 5 A/dm$^2$, the quantity of electricity was 10 C/dm$^2$, and the liquid temperature was 30° C.

Comparative Example 7

A surface-treated copper foil was fabricated under the same conditions as in Example 1 except that, as the conditions for forming the roughening treatment layer, the copper particle layer was formed in the first step under the electrolysis conditions that the current density was 23 A/dm$^2$ and the quantity of electricity was 52 C/dm$^2$, and no chromate treatment layer was provided.

Comparative Example 8

A surface-treated copper foil was fabricated under the same conditions as in Example 1 except that, as the conditions for forming the roughening treatment layer, the copper particle layer was formed in the first step under the electrolysis conditions that the current density was 23 A/dm$^2$ and the quantity of electricity was 52 C/dm$^2$, and no chromate treatment layer or silane coupling agent treatment layer was provided.

The treatment conditions for the surface-treated copper foils of the Examples and Comparative Examples are listed in [Table 1].

TABLE 1

| | Roughening treatment layer | | | | | | |
|---|---|---|---|---|---|---|---|
| | Copper particle layer | | Copper plating treatment | | Heat-resistant | | Silane |
| | Current density (A/dm$^2$) | Quantity of electricity (C/dm$^2$) | Current density (A/dm$^2$) | Quantity of electricity (C/dm$^2$) | treatment layer (type) | Chromate treatment layer | coupling treatment layer |
| Ex. 1 | 25 | 50 | 10 | 120 | Co—Mo | ○ | ○ |
| Ex. 2 | 22 | 55 | 10 | 120 | Co—Mo | ○ | ○ |
| Ex. 3 | 23 | 52 | 10 | 120 | Co—Mo | ○ | — |
| Comp. Ex. 1 | 16 | 40 | 10 | 120 | Co—Mo | ○ | ○ |
| Comp. Ex. 2 | 24 | 60 | 10 | 120 | Co—Mo | ○ | ○ |
| Comp. Ex. 3 | 50 | 125 | 5 | 440 | Co—Mo | ○ | ○ |
| Comp. Ex. 4 | 50 | 130 | — | — | Co—Mo | ○ | ○ |
| Comp. Ex. 5 | 22 | 55 | 10 | 120 | — | ○ | ○ |
| Comp. Ex. 6 | 22 | 55 | 10 | 120 | Ni—P | ○ | ○ |
| Comp. Ex. 7 | 23 | 52 | 10 | 120 | Co—Mo | — | ○ |
| Comp. Ex. 8 | 23 | 52 | 10 | 120 | Co—Mo | — | — |

<Fabrication of Copper-Clad Laminate A>

The treatment surface of each of the surface-treated copper foils of the Examples and Comparative Examples, serving as the surface to be bonded, was placed on one or each side of a fluorocarbon resin-containing substrate (manufactured by Rogers Corporation/RO3003/nominal thickness: 100 μm) and was subjected to heat-pressure forming using a vacuum heat press (manufactured by Kitagawa Seiki Co., Ltd./KVHC-II) in a vacuum at a temperature of 370° C. and a surface pressure of 3 MPa for 45 minutes to obtain a copper-clad laminate A.

<Fabrication of Copper-Clad Laminate B>

The treatment surface of each of the surface-treated copper foils of the Examples and Comparative Examples, serving as the surface to be bonded, was placed on one or each side of a liquid crystal polymer resin substrate (manufactured by Kuraray Co., Ltd./CTQ-50/nominal thickness: 50 μm) and was subjected to heat-pressure forming using a vacuum heat press (manufactured by Kitagawa Seiki Co., Ltd./KVHC-II) in a vacuum at a temperature of 300° C. and a surface pressure of 4 MPa for 10 minutes to obtain a copper-clad laminate B.

The surface-treated copper foils were evaluated by the following methods.

<Measurement of Primary Particle Size>

The primary particle size was determined by observing the surface on which the roughening treatment layer was formed under a scanning electron microscope SEM (manufactured by JEOL Ltd./JSM-6010LA) at an inclination angle of 0° and a magnification of 10,000 times, measuring the maximum length of each of ten copper particles from the resulting SEM image, and calculating the average thereof.

<Measurement of Gloss>

The gloss of the treatment surface was determined by measuring the specular gloss at 85° (Gs) (85°) in accordance with JIS Z 8741 using a gloss meter (manufactured by Konica Minolta, Inc./GM-268A).

<Measurement of Surface Roughness>

The arithmetic mean height Sa was measured under a laser microscope (manufactured by Olympus Corporation/LEXT OLS5000), which is a confocal microscope conforming to ISO 25178-607, in accordance with JPCA-KHS01 (2021) in an evaluation region with a size of 125 μm×125 μm, with the S-filter being 0.5 μm, the L-filter being 50 μm, and the F-operation being a multidimensional curved surface (cubic).

<Peel Strength in Normal State>

A copper circuit with a width of 10 mm was formed on the copper-clad laminate A fabricated as described above using an etching device (manufactured by Ninomiya System Co., Ltd./SPE-40) and was used as a test specimen.

The peel strength was measured using a universal testing machine in accordance with JIS C 6481. A peel strength of 0.53 kN/m or more was evaluated as "○", and a peel strength of less than 0.53 kN/m was evaluated as "x".

<Peel Strength after Heating Treatment>

The test specimen having the circuit with a width of 10 mm formed on the copper-clad laminate A fabricated as described above was subjected to heating treatment using a thermostatic device at a temperature of 177° C. in an air atmosphere for five days and was used as a test specimen.

The peel strength after heating treatment was measured using a universal testing machine in accordance with JIS C 6481. A peel strength of 0.53 kN/m or more was evaluated as "○", and a peel strength of less than 0.53 kN/m was evaluated as "x".

<Transmission Characteristics>

A single-end microstrip circuit was formed on the copper-clad laminate B obtained as described above using an etching device (manufactured by Ninomiya System Co., Ltd./SPE-40) and was used as a test specimen.

The test specimen had a circuit length of 100 mm, and the circuit width was set such that the characteristic impedance was 50Ω.

The insertion loss (S21) of the test specimen at a frequency of 20 GHz was measured using a network analyzer (manufactured by Keysight Technologies/E5071C). An insertion loss of −4.4 dB/100 mm or more was evaluated as "○", and an insertion loss of less than −4.4 dB/100 mm was evaluated as "x".

<Comprehensive Evaluation>

The evaluations for peel strength in a normal state, peel strength after heating treatment, and transmission characteristics were combined together. A surface-treated copper foil that was evaluated as ○ in all of the above tests was evaluated as "○", and a surface-treated copper foil that was evaluated as x in one or more of the above tests was evaluated as "x".

The results for the adhesion, heat resistance, and transmission characteristics of the surface-treated copper foils of the Examples and Comparative Examples are listed in [Table 2].

particles having a primary particle size of 0.5 μm to 0.9 μm and therefore has a superior anchor effect on an insulating resin substrate. In addition, the surface-treated copper foil includes a heat-resistant treatment layer containing cobalt and molybdenum on the roughening treatment layer and a chromate treatment layer containing chromium on the heat-resistant treatment layer. Therefore, the surface of the roughening treatment layer is less susceptible to oxidation, and the copper particles are also less susceptible to deformation. Thus, the surface-treated copper foil can maintain high adhesion and achieve high heat resistance on a low-dielectric resin substrate with high forming temperature. Furthermore, the chromate treatment layer has a treatment surface with a gloss Gs (85°) of 60 to 80 and the copper particles are sparsely formed, which results in low insertion loss. Thus, the surface-treated copper foil is suitable for use in the manufacture of a printed wiring board for high-frequency signal transmission that includes a low-dielectric resin substrate with a forming temperature of 300° C. or higher.

Therefore, the present invention has high industrial applicability.

The invention claimed is:

1. A surface-treated copper foil comprising a roughening treatment layer on at least one surface of an untreated copper foil, a heat-resistant treatment layer on the roughening treatment layer, and a chromate treatment layer on the heat-resistant treatment layer, the roughening treatment layer being formed of copper particles having a primary particle size of 0.5 μm or more and 0.9 μm or less, the heat-resistant treatment layer being a heat-resistant treatment layer containing cobalt and molybdenum, the chromate treatment layer having a treatment surface with a gloss Gs (85°) of 60 or more and 80 or less.

2. The surface-treated copper foil according to claim 1, wherein each of the roughening treatment layer, the heat-resistant treatment layer, and the chromate treatment layer has a treatment surface with an arithmetic mean height Sa of 0.08 μm or more and 0.16 μm or less.

TABLE 2

| | Treatment surface | | | Peel strength | | | | Transmission characteristics S21 at 20 GHz | | |
|---|---|---|---|---|---|---|---|---|---|---|
| | Particle size (roughening treatment) | Sa | Gloss (chromate) | In normal state | | After heating | | (dB/100 mm) | Evaluation | Comprehensive evaluation |
| | (μm) | (μm) | Gs (85°) | (kN/m) | Evaluation | (kN/m) | Evaluation | | | |
| Ex. 1 | 0.6 | 0.15 | 78 | 0.99 | ○ | 0.56 | ○ | −4.3 | ○ | ○ |
| Ex. 2 | 0.8 | 0.09 | 63 | 1.10 | ○ | 0.61 | ○ | −4.4 | ○ | ○ |
| Ex. 3 | 0.7 | 0.12 | 67 | 0.94 | ○ | 0.55 | ○ | −4.4 | ○ | ○ |
| Comp. Ex. 1 | 0.6 | 0.04 | 97 | 0.38 | x | 0.25 | x | −4.3 | ○ | x |
| Comp. Ex. 2 | 0.7 | 0.13 | 53 | 1.05 | ○ | 0.76 | ○ | −4.6 | x | x |
| Comp. Ex. 3 | 2.0 | 0.15 | 66 | 0.57 | ○ | 0.27 | x | −4.3 | ○ | x |
| Comp. Ex. 4 | 0.4 | 0.07 | 72 | 1.06 | ○ | 0.47 | x | −4.0 | ○ | x |
| Comp. Ex. 5 | 0.8 | 0.09 | 62 | 1.03 | ○ | 0.19 | x | −4.1 | ○ | x |
| Comp. Ex. 6 | 0.8 | 0.09 | 70 | 1.12 | ○ | 0.21 | x | −4.2 | ○ | x |
| Comp. Ex. 7 | 0.7 | 0.12 | 67 | 0.80 | ○ | 0.21 | x | −4.4 | ○ | x |
| Comp. Ex. 8 | 0.7 | 0.12 | 67 | 0.77 | ○ | 0.23 | x | −4.4 | ○ | x |

Examples 1 to 3 demonstrated that the surface-treated copper foil of the present invention has a peel strength of 0.53 kN/m or more, which is a high value that does not cause a problem in practical use, both in a normal state and after heating treatment, and also has an insertion loss S21 of −4.4 dB/100 mm or more at a high frequency, i.e., a frequency of 20 GHz, which indicates good transmission characteristics.

INDUSTRIAL APPLICABILITY

The surface-treated copper foil of the present invention includes a roughening treatment layer formed of copper

3. The surface-treated copper foil according to claim 1, comprising a silane coupling agent treatment layer on the chromate treatment layer.

4. A copper-clad laminate comprising an insulating resin substrate on which a treatment surface of the surface-treated copper foil according to claim 1 is laminated.

5. The copper-clad laminate according to claim 4, wherein the insulating resin substrate is an insulating resin substrate selected from an epoxy resin substrate, a polyimide resin substrate, a polyphenylene ether resin substrate, a bismaleimide-triazine resin substrate, a cycloolefin polymer resin substrate, a liquid crystal polymer resin substrate, and a fluorine-containing resin substrate.

6. A printed wiring board comprising the copper-clad laminate according to claim 4.

* * * * *